United States Patent
Hanna et al.

(10) Patent No.: US 10,452,798 B1
(45) Date of Patent: Oct. 22, 2019

(54) SYSTEM, METHOD, AND COMPUTER PROGRAM PRODUCT FOR FILTERING ONE OR MORE FAILURES IN A FORMAL VERIFICATION

(71) Applicant: Cadence Design Systems, Inc., San Jose, CA (US)

(72) Inventors: Nizar Hanna, Karmeil (IL); Habeeb Farah, Nazareth (IL); Almothana Sarhan, Nahef (IL); Doron Bustan, Zichron Yaakov (IL)

(73) Assignee: Cadence Design Systems, Inc., San Jose, CA (US)

( * ) Notice: Subject to any disclaimer, the term of this patent is extended or adjusted under 35 U.S.C. 154(b) by 68 days.

(21) Appl. No.: 15/808,094

(22) Filed: Nov. 9, 2017

(51) Int. Cl.
    *G06F 17/50* (2006.01)
(52) U.S. Cl.
    CPC .................. *G06F 17/504* (2013.01)
(58) Field of Classification Search
    USPC ........................................................ 716/106
    See application file for complete search history.

(56) References Cited

U.S. PATENT DOCUMENTS

| | | | |
|---|---|---|---|
| 2004/0025122 A1* | 2/2004 | Schubert | G06F 17/5022 716/106 |
| 2004/0162805 A1* | 8/2004 | Wozniak | G06F 17/5022 |
| 2005/0193280 A1* | 9/2005 | Schubert | G01R 31/31704 714/47.1 |
| 2006/0100873 A1* | 5/2006 | Bittner | G06F 17/5036 704/256.2 |
| 2010/0313175 A1* | 12/2010 | Petlin | G06F 17/504 716/106 |

* cited by examiner

*Primary Examiner* — Mohammed Alam
(74) *Attorney, Agent, or Firm* — Mark H. Whittenberger, Esq; Holland & Knight LLP

(57) ABSTRACT

The present disclosure relates to a method for use in a formal verification of an electronic design. Embodiments may include providing, using at least one processor, an electronic design and performing formal verification of at least a portion of the electronic design having an original property. Embodiments may further include analyzing at least one output net bit associated with a check of the electronic design. Embodiments may also include generating a structural observability expression, based upon, at least in part, the at least one output net bit and setting the structural observability expression as a precondition to the original property.

20 Claims, 4 Drawing Sheets

SYSTEM, METHOD, AND COMPUTER PROGRAM PRODUCT FOR FILTERING ONE OR MORE FAILURES IN A FORMAL VERIFICATION

FIELD OF THE INVENTION

The present disclosure relates to electronic design verification, and more specifically, to a method for filtering one or more failures in a formal verification.

DISCUSSION OF THE RELATED ART

Formal verification relies upon a system of constraints to communicate the legal state space to the proof engines. Prelayout design rule checking, sometimes referred to as linting, may produce many checks out of which a large number of violations might be reported. Designers are often unhappy with the large number of violations that such tools report and would like the tools to filter noise more adequately.

SUMMARY OF DISCLOSURE

In one or more embodiments of the present disclosure, a computer-implemented method for use in a formal verification of an electronic design is provided. The method may include providing, using at least one processor, an electronic design and performing formal verification of at least a portion of the electronic design having an original property. The method may further include analyzing at least one output net bit associated with a check of the electronic design. The method may also include generating a structural observability expression, based upon, at least in part, the at least one output net bit and setting the structural observability expression as a precondition to the original property.

One or more of the following features may be included. In some embodiments, generating the structural observability expression may include generating the structural observability expression for at least one of a flop, latch, or primary output. The check may include an arithmetic operation selected from the group consisting of a MUX, selector, AND, OR, NAND, or NOR gate. Analyzing may include analyzing a plurality of propagation paths. The method may include stopping the analysis at a boundary. The boundary may be at least one of a flop, latch, primary output, or black box input. The method may further include optimizing the structural observability expression using a binary decision diagram ("BDD").

In one or more embodiments of the present disclosure a computer-readable storage medium having stored thereon instructions, which when executed by a processor result in one or more operations is provided. Operations may include providing, using at least one processor, an electronic design and performing formal verification of at least a portion of the electronic design having an original property. Operations may further include analyzing at least one output net bit associated with a check of the electronic design. Operations may also include generating a structural observability expression, based upon, at least in part, the at least one output net bit and setting the structural observability expression as a precondition to the original property.

One or more of the following features may be included. In some embodiments, generating the structural observability expression may include generating the structural observability expression for at least one of a flop, latch, or primary output. The check may include an arithmetic operation selected from the group consisting of a MUX, selector, AND, OR, NAND, or NOR gate. Analyzing may include analyzing a plurality of propagation paths. Operations may include stopping the analysis at a boundary. The boundary may be at least one of a flop, latch, primary output, or black box input. Operations may further include optimizing the structural observability expression using a binary decision diagram ("BDD").

In one or more embodiments of the present disclosure, a system for electronic design verification is provided. The system may include one or more processors configured to receive, using at least one processor, an electronic design and perform formal verification of at least a portion of the electronic design having an original property. The one or more processors may be further configured to analyze at least one output net bit associated with a check of the electronic design. The one or more processors may be further configured to generate a structural observability expression, based upon, at least in part, the at least one output net bit and setting the structural observability expression as a precondition to the original property.

One or more of the following features may be included. In some embodiments, generating the structural observability expression may include generating the structural observability expression for at least one of a flop, latch, or primary output. The check may include an arithmetic operation selected from the group consisting of a MUX, selector, AND, OR, NAND, or NOR gate. Analyzing may include analyzing a plurality of propagation paths. The one or more processors may be further configured to stop the analysis at a boundary. The boundary may be at least one of a flop, latch, primary output, or black box input.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
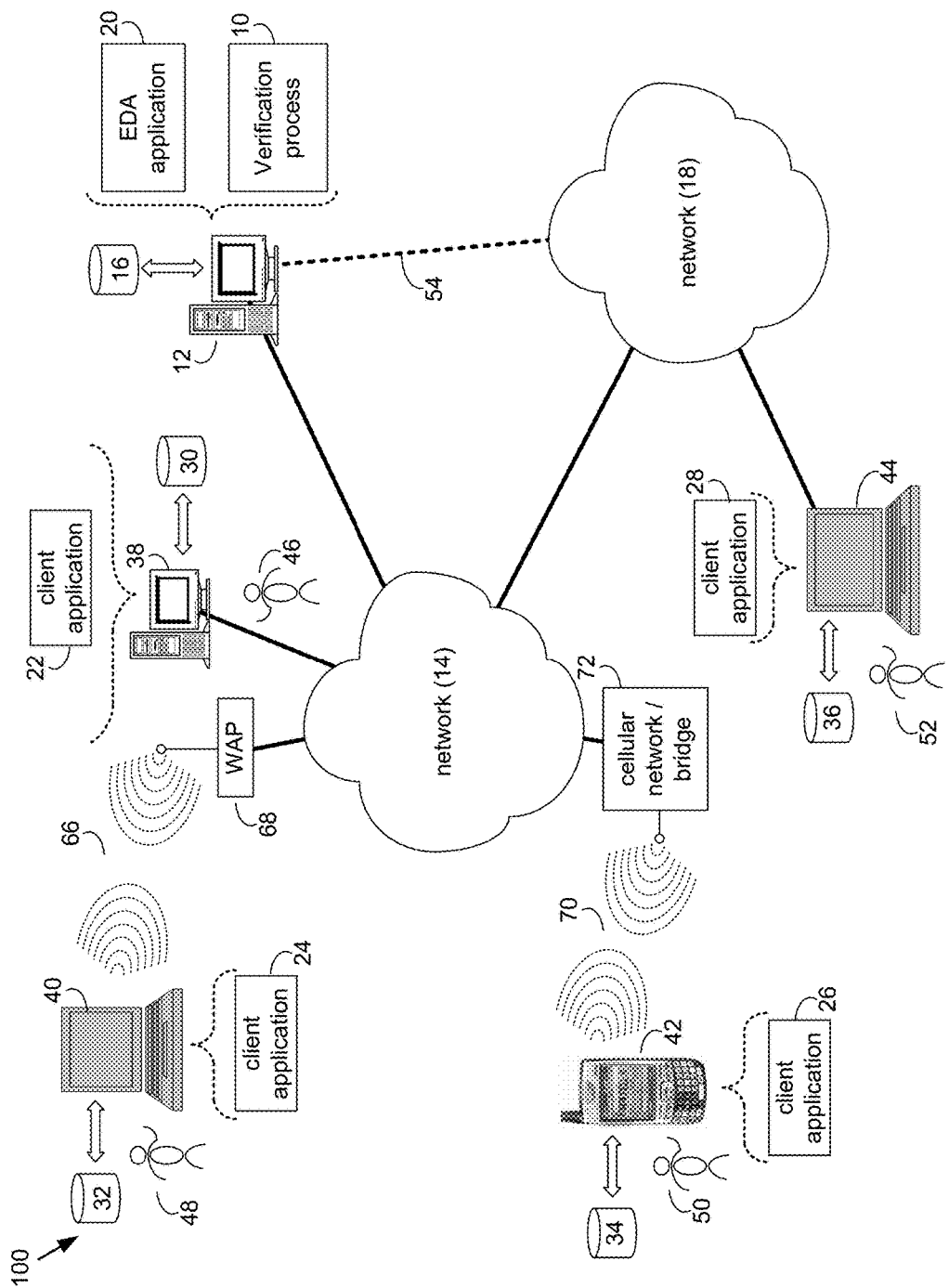
FIG. 1 is a diagram depicting an embodiment of a system in accordance with the present disclosure.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

One or more hardware description languages may be used in accordance with the present disclosure. Some hardware description languages may include, but are not limited to, Verilog, VHDL, SystemC, SystemVerilog and Verilog-AMS. Various other hardware description languages may also be used as well.

Referring to FIG. 1, there is shown a verification process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, verification process 10 may reside on and be executed, in whole or in part, by a client electronic device, such as a personal computer, notebook computer, personal digital assistant, or the like.

The instruction sets and subroutines of verification process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Web server is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for electronic design optimization.

Verification process 10 may be a stand alone application, or may be an applet/application/script that may interact with and/or be executed within EDA application 20. In addition/as an alternative to being a server-side process, verification process 10 may be a client-side process (not shown) that may reside on a client electronic device (described below) and may interact with an EDA client application (e.g., one or more of EDA client applications 22, 24, 26, 28). Further, verification process 10 may be a hybrid server-side/client-side process that may interact with EDA application 20 and an EDA client application (e.g., one or more of client applications 22, 24, 26, 28). As such, verification process 10 may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize verification process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both).

Figure 2:
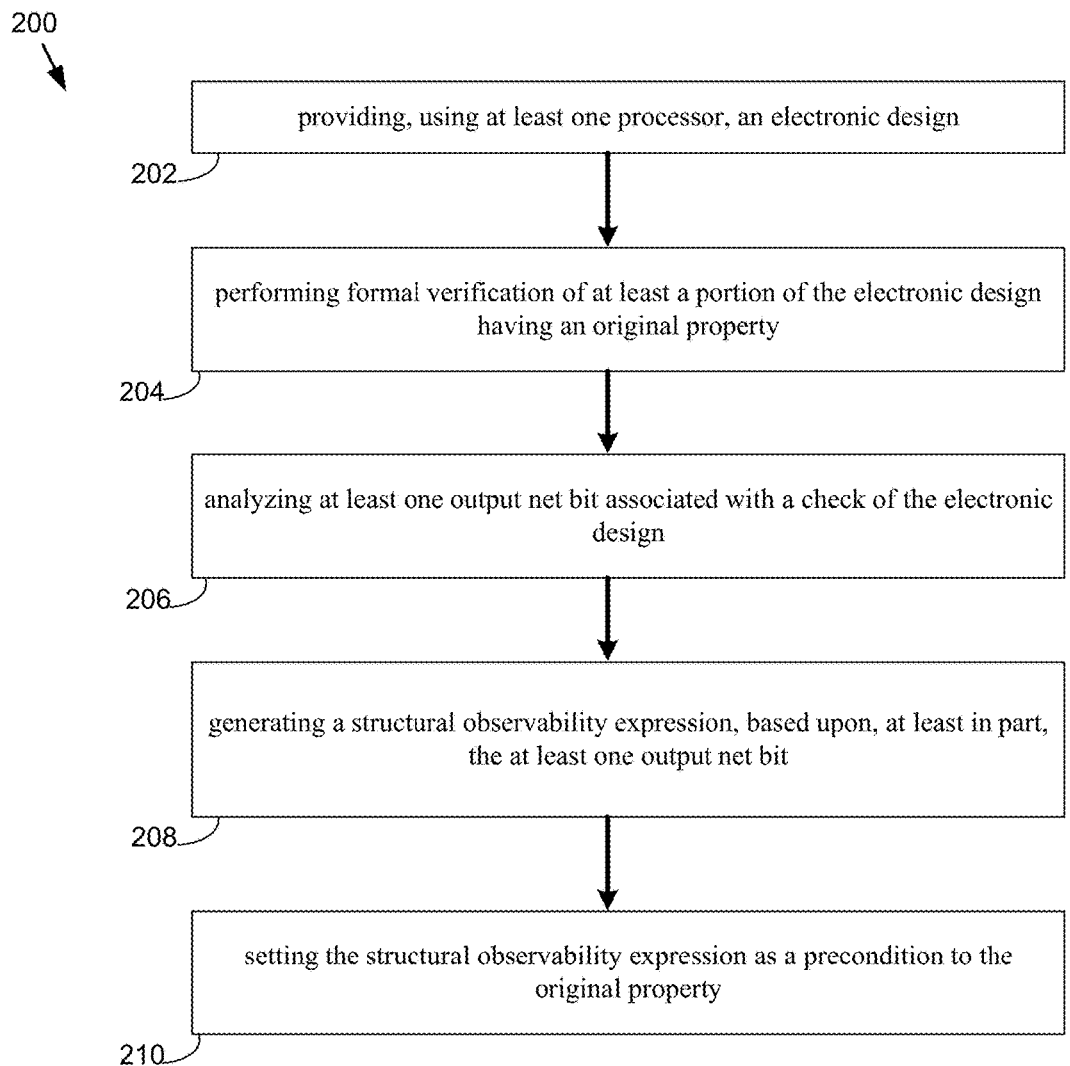
FIG. 2 is a flowchart depicting operations consistent with the verification process in accordance with an embodiment of the present disclosure.

Referring now to FIG. 2, an exemplary flowchart 200 depicting operations consistent with verification process 10 is provided. Operations may include providing (202), using at least one processor, an electronic design and performing (204) formal verification of at least a portion of the electronic design having an original property. Embodiments may further include analyzing (206) at least one output net bit associated with a check of the electronic design. Embodiments may also include generating (208) a structural observability expression, based upon, at least in part, the at least one output net bit and setting (210) the structural observability expression as a precondition to the original property.

As discussed above, prelayout design rule checking, sometimes referred to as linting, may produce many checks out of which a large number of violations might be reported. Designers are often unhappy with the large number of violations that such tools report and would like the tools to filter noise more adequately.

As used herein, a rule or check may refer to an algorithm that is configured to verify a specific potential violation in the RTL. Part of those checks may be based on structural analysis while others are using formal methods to verify and report violations.

In some embodiments, the observability filtering may be related to formal check types (e.g., assertions, etc.). The check types applying this filter may include, but is not limited to, arithmetic overflow checks, out of bound checks, bus contention checks, floating bus checks, x assignment checks, unreachable default case checks, etc. Each of these is discussed in further detail below.

In some embodiments, an arithmetic overflow check may be configured to confirm that the RTL contains no errors that could cause the array to overflow. For example, in the following code snippet, the value of out must never fold to 4 b0000 when you add 1 b1:

logic [3:0] d_array;
out=d_array+1 b1;

A violation indicates an RTL error, which may cause the array to overflow.

In some embodiments, an out-of-bound indexing check may be configured to confirm that expressions and arrays are indexed within the defined range. For example, in the following code snippet, the index i must be in the range from 0 to 3:

logic [3:0] d_array;
out=d_array[i];

A violation might indicate an RTL error, which can cause indexing of an undefined element in the array.

In some embodiments, a bus contention check may be configured to check for a scenario where more than one active driver for the bus is present. A floating bus check may be configured to check for a scenario where a bus is without a driver. An x assignment check may be configured to confirm that x variables cannot be reached. If an x-assignment is reachable, it becomes an active source of x, and can lead to unexpected functionality. An unreachable default case check may be configured to confirm that default case statements cannot be reached. Violations could be the result of an incompletely specified case.

In some embodiments, one or more filters may be configured to filter failed assertions if a failure is not observed on the nearest registers (e.g., flop/latch) or on the primary outputs. In some embodiments, verification process 10, including the structural observability filter technology described herein, may be configured to calculate the SystemVerilog ("SVA") expression for the observability of the check output and add it to the assertion as a precondition. Accordingly, all the non-observed failures may be filtered.

Existing tools are not filtering the failures that are producing large noise. Alternatively, they may be using formal propagation methods that take too much time attempting to filter the non propagating failures. As such, these tools are just automatically creating assertions to check potential failures without considering the user responsible for the code of those failures.

Accordingly, in some embodiments, verification process 10 may include a structural observability filter configured to perform structural analysis starting from the checks output net bit and to calculate the structural observability expression for all of the nearest flops, latches and primary outputs.

In some embodiments, these calculations may consider all Muxes selectors in the paths as well as local expressions of AND, OR, NAND, and/or NOR statements if the designer is grading the failure by masking the statement with AND for example, then the solution will consider this in the filtering expression.

For example, if the tool is checking an arithmetic overflow for:
assign c<=(a+b); and is creating the property p1. Then, if the assertion p1 fails the tool may report a violation. Assuming that when p1 is failing the designer has a "cond1", "cond2" which are guarding the propagation of the overflow—
assign c<=cond1 & (a+b);
. . .
always . . . if (cond2) flop<=c;

Accordingly, the structural observability filter may calculate the observability expression "cond1 & cond2" and modify the assertion to: "(cond1 && cond2)|→p1 so that the violation would be received if it only happens when the guarding condition is true. The solution considers for the observability condition all the conditions of the Muxes to all paths and also the local conditions with and, or . . . etc. masking.

In some embodiments, when adding the preconditions to the assertions, only the propagated failures may be reported while the non-propagated assertions will pass.

In some embodiments, there are a number of motivations for addressing the observability and noise reduction concepts described herein. For example, each arithmetic operation may cause an overflow/underflow. When a signal indexing is used to read a value from an array, the index-signal may overflow from the bounds of the array, that would be replaced by an 'x' value. However, the customer may have resolved the issue of using the wrong values by masking the reading of the output signal value by conditions. As such, the overflow will not propagate to a flop/latch or primary-output. Accordingly, the counterexamples ("CEXs") of these cases are noise that should be filtered.

In some embodiments, verification process 10 may be configured to mask the property definition by an expression of observability of the output signal to closer flops/latches or primary-output. For example: assign a={N{condition}} & (b+c). Here, the definition will be "condition|→overflow_check" instead of "overflow_check". The output may be observable only if the condition was 1'b1 otherwise no need to check the overflow.

In some embodiments, verification process 10 may include traversing on one or more outputs of the operations. Building the observability expression which includes all conditions on Muxes, selectors and some local gates which are common coding style for masking overflows (e.g., AND, OR, NAND, NOR, etc.). Verification process 10 may be configured to consider multiple paths for propagation (e.g., path1, path2, or pathN). Verification process 10 may be configured to stop on one or more boundaries. Some of these may include, but are not limited to, flop, latch, primary output, black box input, etc. In each step the expression may be built and optimized using binary decision diagrams ("BDDs"). The final observability expression "E" may be added as a precondition to the original property "P": E|→P.

In some embodiments, verification process 10 may include analyzing at least one output net bit associated with a check of the electronic design. Some checks may include, but are not limited to, arithmetic checks, out of bound indexing, x-assignment unreachability, etc. Any arithmetic check may be used in accordance with this disclosure, some of which may include, but are not limited to, a MUX, selector, AND, OR, NAND, NOR gate, etc.

Figure 3:
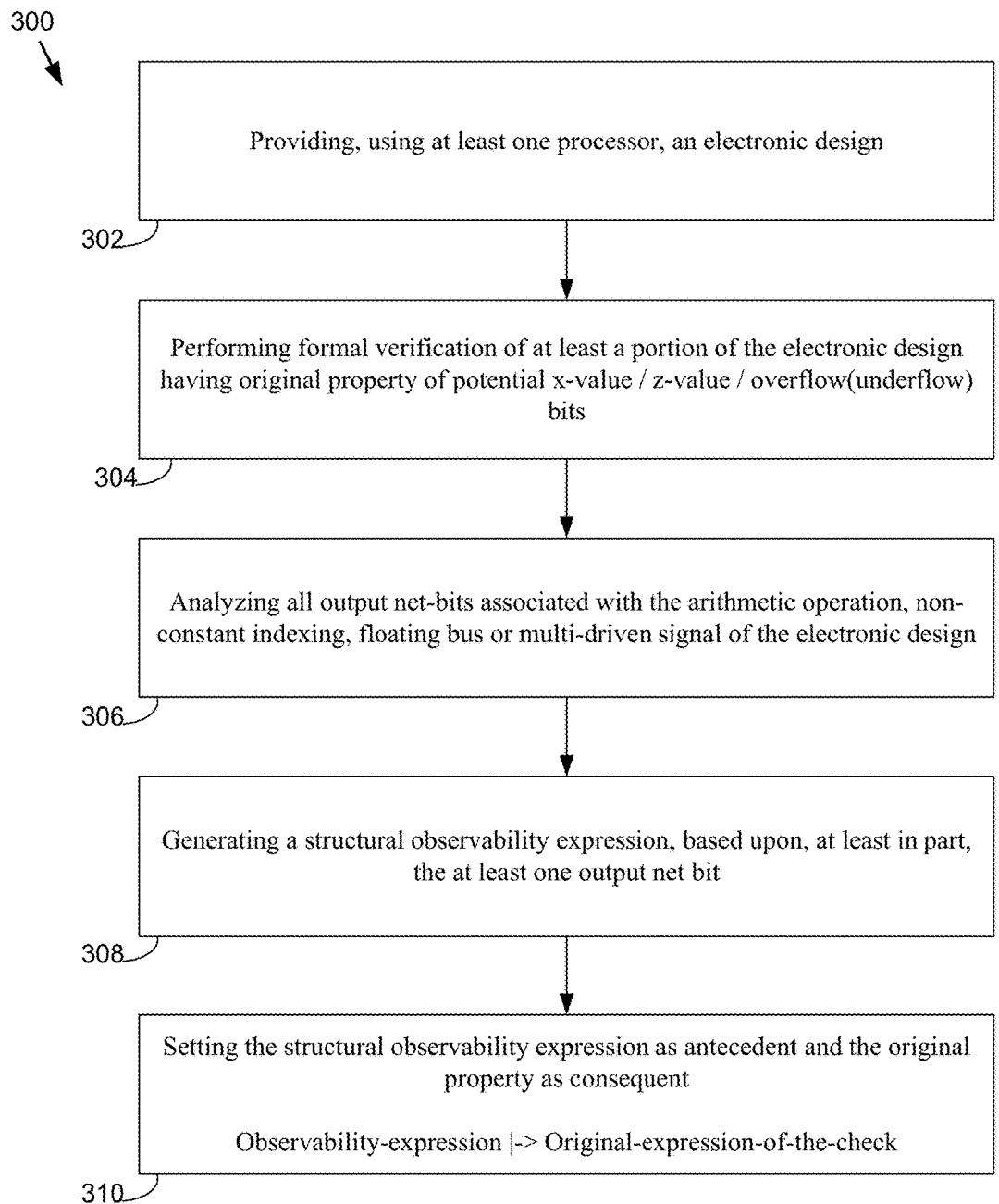
FIG. 3 is a flowchart depicting operations consistent with the verification process in accordance with an embodiment of the present disclosure.

Referring also to FIG. 3, an exemplary flowchart 300 depicting operations consistent with verification process 10 is provided. Operations may include providing (302), using at least one processor, an electronic design and performing (304) formal verification of at least a portion of the electronic design having an original property of potential x-value/z-value/overflow (underflow) bits. Embodiments may further include analyzing (306) all output net-bits associated with the arithmetic operation, non-constant indexing, floating bus and/or multi-driven signal of the electronic design. Embodiments may also include generating (308) a structural observability expression, based upon, at least in part, the at least one output net bit and setting (310) the structural observability expression as antecedent and the original property as consequent. In some embodiments, the observability-expression may correspond to the original-expression-of-the-check.

Figure 4:
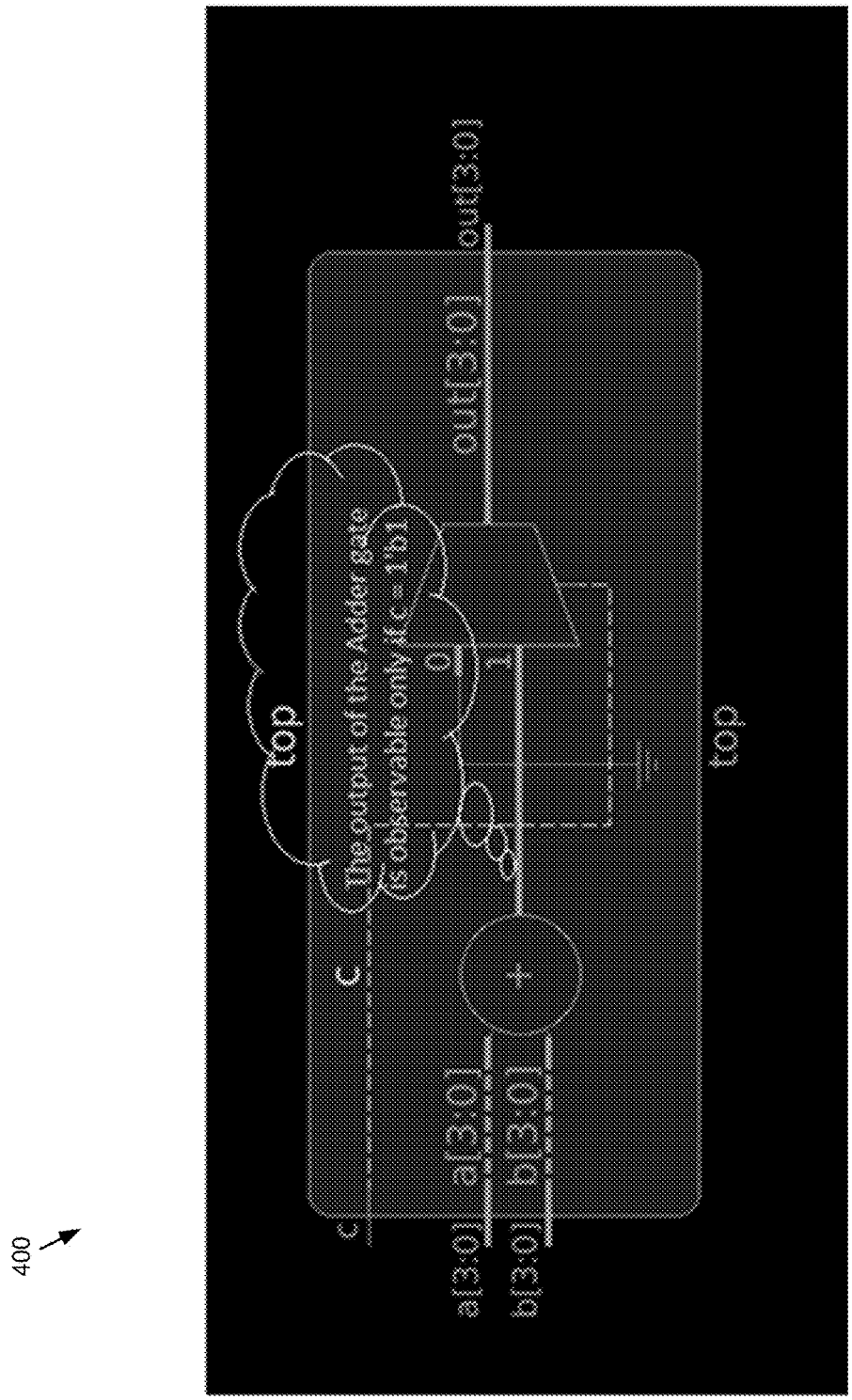
FIG. 4 is a diagram depicting an embodiment of an example in accordance with the present disclosure.

Referring also to FIG. 4, a diagram 400 depicting an example consistent with embodiments of verification process 10 is provided.

Filtering arithmetic overflow:
module top (input [3:0] a, input [3:0] b, input c, output [3:0] out);
logic [3:0] a;
logic [3:0] b;
logic [3:0] out;
logic c;
assign out=(c? a+b: 4'b0);
endmodule
   1) Recognizing arithmetic overflow check: a+b
   2) Computing the observability expression of the output net of the add gate: {c c}
      The observability expression is: (c|c|c|c)=>c
   3) The original expression is ~Bit(5, {{1'b0, a}+{1'b0, b}})
      the observability expression is (c)
      the generated check is: c|→{{1'b0, a}+{1'b0, b}})
   4) In cycles that the signal c is 1'b0 (low value). Then the check will be filtered.
      If the possible values of the signals are:
      1) a=4'b1010, b=4'b0101, c=1'b1
      2) a=4'b1110, b=4'b0111, c=1'b0

In contrast, without filtering (using observability) a counterexample ("CEX") may be obtained with trace: a=4'b1110, b=4'b0111. However, when observability filtering is on, the check status will be proven.

Embodiments of verification process 10 provide numerous advantages over prior techniques. For example, the structural observability filter may reduce the noise with much higher performance and less time than other formal and functional methods. Current implementations don't filter violations based on observability. Other techniques check for the observability by functional and formal propagation methods which takes much more time and performance.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for use in a formal verification of an electronic design comprising:
   providing, using at least one processor, an electronic design;
   performing formal verification of at least a portion of the electronic design having an original property;
   analyzing at least one output net bit associated with a check of the electronic design;
   generating a structural observability expression, based upon, at least in part, the at least one output net bit, wherein the structural observability expression is a condition for observing the at least one output net bit; and
   setting the structural observability expression as a precondition to the original property, wherein setting the structural observability expression as a precondition to the original property includes filtering one or more failures associated with the original property based upon, at least in part, the structural observability expression.

2. The computer-implemented method of claim 1, wherein generating the structural observability expression includes generating the structural observability expression for at least one of a flop, latch, or primary output.

3. The computer-implemented method of claim 1, wherein the check is an arithmetic operation selected from the group consisting of a MUX, selector, AND, OR, NAND, or NOR gate.

4. The computer-implemented method of claim 1, wherein analyzing includes analyzing a plurality of propagation paths.

5. The computer-implemented method of claim 1, further comprising:
   stopping the analysis at a boundary.

6. The computer-implemented method of claim 5, wherein the boundary is at least one of a flop, latch, primary output, or black box input.

7. The computer-implemented method of claim 1, further comprising:
   optimizing the structural observability expression using a binary decision diagram ("BDD").

8. A non-transitory computer-readable storage medium for electronic design verification, the computer-readable storage medium having stored thereon instructions that when executed by a machine result in one or more operations, the operations comprising:
   providing, using at least one processor, an electronic design;
   performing formal verification of at least a portion of the electronic design having an original property;
   analyzing at least one output net bit associated with a check of the electronic design, wherein the check is associated with a potential Register-transfer level (RTL) violation;
   generating a structural observability expression, based upon, at least in part, the at least one output net bit, wherein the structural observability expression is a condition for observing the at least one output net bit; and
   setting the structural observability expression as a precondition to the original property, wherein setting the structural observability expression as a precondition to the original property includes filtering one or more failures associated with the original property based upon, at least in part, the structural observability expression.

9. The computer-readable storage medium of claim 8, wherein generating the structural observability expression includes generating the structural observability expression for at least one of a flop, latch, or primary output.

10. The computer-readable storage medium of claim 8, wherein the check is an arithmetic operation selected from the group consisting of a MUX, selector, AND, OR, NAND, or NOR gate.

11. The computer-readable storage medium of claim 8, wherein analyzing includes analyzing a plurality of propagation paths.

12. The computer-readable storage medium of claim 8, further comprising:
stopping the analysis at a boundary.

13. The computer-readable storage medium of claim 12, wherein the boundary is at least one of a flop, latch, primary output, or black box input.

14. The computer-readable storage medium of claim 8, further comprising:
optimizing the structural observability expression using a binary decision diagram ("BDD").

15. A system for use in a formal verification of an electronic design comprising:
a computing device having at least one processor configured to receive, using at least one processor, an electronic design, the at least one processor further configured to perform formal verification of at least a portion of the electronic design having an original property, the at least one processor further configured to analyze at least one output net bit associated with a check of the electronic design, the at least one processor further configured to generate a structural observability expression, based upon, at least in part, the at least one output net bit, wherein the structural observability expression is a condition for observing the at least one output net bit, the at least one processor further configured to set the structural observability expression as a precondition to the original property, wherein setting the structural observability expression as a precondition to the original property includes filtering one or more failures associated with the original property based upon, at least in part, the structural observability expression indicating that the at least one output net bit is masked.

16. The system of claim 15, wherein generating the structural observability expression includes generating the structural observability expression for at least one of a flop, latch, or primary output.

17. The system of claim 15, wherein the check is an arithmetic operation selected from the group consisting of a MUX, selector, AND, OR, NAND, or NOR gate.

18. The system of claim 15, wherein analyzing includes analyzing a plurality of propagation paths.

19. The system of claim 15, wherein the at least one processor is further configured to:
stop the analysis at a boundary.

20. The system of claim 19, wherein the boundary is at least one of a flop, latch, primary output, or black box input.

* * * * *